(12) United States Patent
Rodrigo et al.

(10) Patent No.: US 10,026,597 B2
(45) Date of Patent: Jul. 17, 2018

(54) HYDROGEN PLASMA BASED CLEANING PROCESS FOR ETCH HARDWARE

(71) Applicant: Applied Materials, Inc., Santa Clara, CA (US)

(72) Inventors: Chirantha Rodrigo, Santa Clara, CA (US); Jingchun Zhang, Milpitas, CA (US); Lili Ji, Santa Clara, CA (US); Anchuan Wang, San Jose, CA (US); Nitin K. Ingle, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/397,429

(22) Filed: Jan. 3, 2017

(65) Prior Publication Data

US 2017/0200590 A1 Jul. 13, 2017

Related U.S. Application Data

(60) Provisional application No. 62/278,255, filed on Jan. 13, 2016.

(51) Int. Cl.
| | |
|---|---|
| *H01J 37/32* | (2006.01) |
| *H01L 21/311* | (2006.01) |
| *C23C 16/44* | (2006.01) |
| *H01L 21/67* | (2006.01) |

(52) U.S. Cl.
CPC .... *H01J 37/32862* (2013.01); *C23C 16/4405* (2013.01); *H01J 37/3244* (2013.01); *H01J 37/32357* (2013.01); *H01L 21/31116* (2013.01); *H01L 21/31138* (2013.01); *H01L 21/67069* (2013.01); *H01J 37/32724* (2013.01); *H01J 2237/334* (2013.01); *Y10S 438/905* (2013.01)

(58) Field of Classification Search
None
See application file for complete search history.

(56) References Cited

U.S. PATENT DOCUMENTS

| | | | |
|---|---|---|---|
| 6,090,304 A | 7/2000 | Zhu et al. | |
| 9,397,011 B1 | 7/2016 | Fang et al. | |
| 2003/0183244 A1* | 10/2003 | Rossman | B08B 7/0035 134/1.1 |

(Continued)

FOREIGN PATENT DOCUMENTS

| | | |
|---|---|---|
| JP | 5703315 B2 | 4/2015 |
| KR | 20130012671 A | 2/2013 |

OTHER PUBLICATIONS

International Search Report and Written Opinion for PCT/US2016/069204 dated Apr. 17, 2017.

*Primary Examiner* — Jiong-Ping Lu
(74) *Attorney, Agent, or Firm* — Patterson + Sheridan LLP

(57) ABSTRACT

The present disclosure provides methods for cleaning chamber components post substrate etching. In one example, a method for cleaning includes activating an etching gas mixture using a plasma to create an activated etching gas mixture, the etching gas mixture comprising hydrogen-containing precursor and a fluorine-containing precursor and delivering the activated etching gas mixture to a processing region of a process chamber, the process chamber having an edge ring positioned therein, the edge ring comprising a catalyst and anticatalytic material, wherein the activated gas removes the anticatalytic material from the edge ring.

20 Claims, 2 Drawing Sheets

(56) References Cited

U.S. PATENT DOCUMENTS

Figure 1:
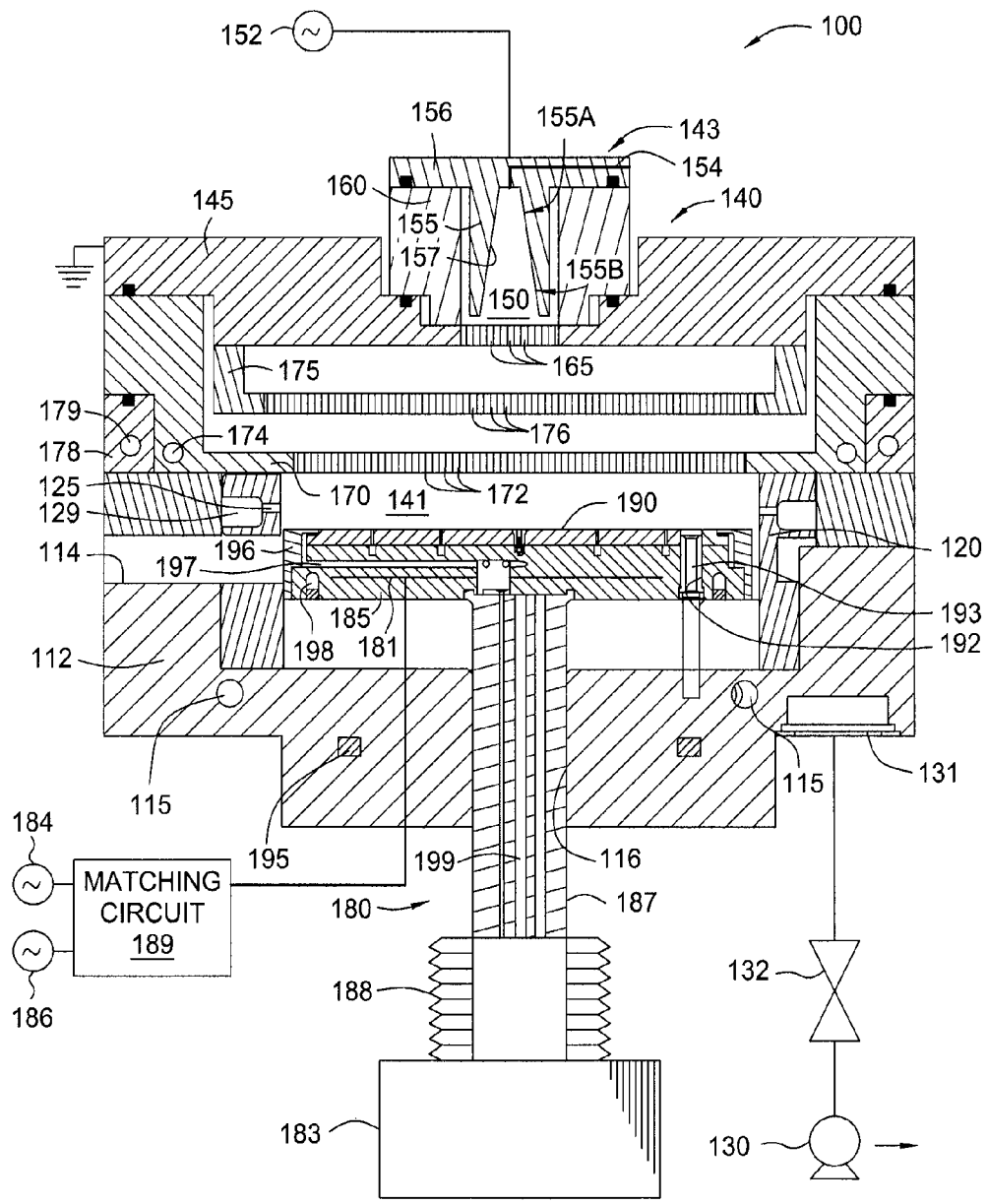

2006/0051966 A1* 3/2006 Or .................... H01J 37/32082
                                                            438/706
2010/0099263 A1  4/2010 Kao et al.

* cited by examiner

HYDROGEN PLASMA BASED CLEANING PROCESS FOR ETCH HARDWARE

CROSS-REFERENCE TO RELATED APPLICATIONS

This application claims benefit of U.S. Provisional Application Ser. No. 62/278,255 filed Jan. 13, 2016, which is incorporated by reference in its entirety.

BACKGROUND

Field

Implementations of the present invention generally relate to methods for cleaning etch hardware used in semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

When forming these features, an etch process using a photoresist layer as an etching mask is often utilized. An edge-ring can be used to control the region of the substrate available to the etchant. Typically, etchants accumulate at the exposed substrate surface near the edge-ring, which can lead to over-etching of that region (also referred to as edge roll-up). Wafer edge etch-amounts (EAs) are controlled using a Nickel edge-ring (Ni-ER), placed around the wafer. Metallic Ni removes excess etchants near wafer edges by acting as a chemical catalyst, which quenches excess etchants.

Some production wafers, however, contain variable amounts of metal compounds, such as TiN. Even in etch processes with a good selectivity towards these compounds (e.g., greater than 500:1), small quantities can be etched during the Si etch process. Airborne Ti species get deposited on chamber parts, such as aluminum components of the process kit and the Ni-ER. The Ti can then affect the catalytic activity of Ni-ER, thus preventing the protective activity of the Ni-ER. Loss of ER catalytic activity can lead to strong Si etching near the wafer edge and poor etch uniformity on Si films, which can include a non-uniformity percentage of 12% or higher.

Some have attempted to recover the etch profiles by high temperature bake-out of the contaminated components (e.g., baking at temperatures of 160° C.) and parts wipe-down (e.g., using wet and dry wipes) without success. Other options include replacing all component parts and edge ring with new components. However, replacement of components is both time consuming and not cost effective.

Therefore, there is a need in the art for methods of cleaning or restoring the activity of etch chamber components.

SUMMARY

The present disclosure provides methods for recovering chamber components from Ti-poisoning after an etch process in semiconductor applications. In one example, a cleaning method can include activating an etching gas mixture using a plasma to create an activated etching gas mixture, the etching gas mixture comprising hydrogen-containing precursor and a fluorine-containing precursor; and delivering the activated etching gas mixture to a processing region of a process chamber, the process chamber having an edge ring positioned therein, the edge ring comprising a catalyst and anticatalytic material, wherein the activated gas removes the anticatalytic material from the edge ring.

In another example, a method for processing a substrate can include etching a substrate positioned in a processing region of a process chamber, the substrate being positioned in conjunction with an edge ring comprising a catalyst, wherein etching the substrate deposits an anticatalytic material on the edge ring; removing the substrate from the processing region; forming a remote plasma using a etching gas mixture, the etching gas mixture comprising a hydrogen-containing precursor and a fluorine-containing precursor; and delivering the remote plasma to the edge ring in the processing region, wherein the remote plasma removes the anticatalytic material from the edge ring.

In another example, a device cleaning method can include delivering a etching gas mixture to a plasma cavity of a process chamber, the process chamber having an edge ring, the edge ring comprising nickel and less than 5% atomic weight titanium; forming a remote plasma using a etching gas mixture, the etching gas mixture comprising $H_2$ and $NF_3$, the ratio of the concentration of $H_2$ to $NF_3$ being at least a 3:1 ratio, wherein the antecedent of the ratio determines the minimum value; and delivering the remote plasma from the plasma cavity to a processing region of the process chamber, wherein the remote plasma removes the anticatalytic material from the edge ring.

DETAILED DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

Figure 2:
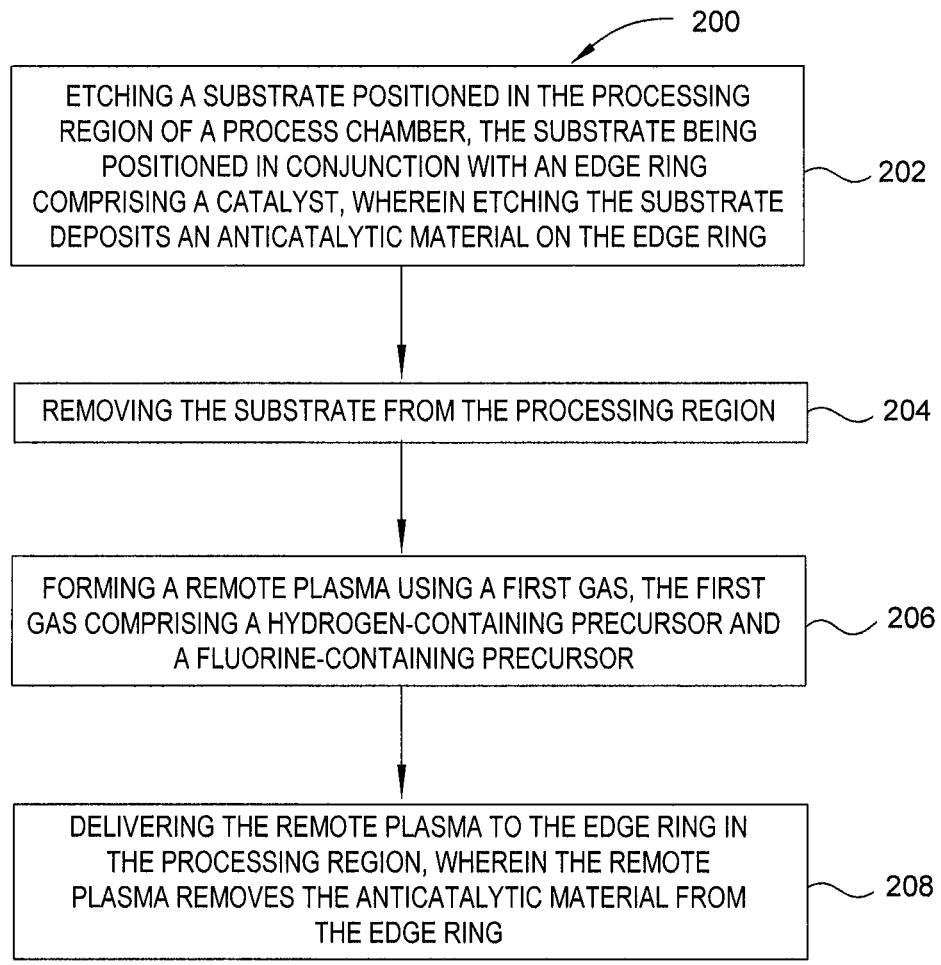

FIG. 1 depicts an etching process chamber which may be utilized to perform an etching process on a substrate;

FIG. 2 depicts a flow diagram of a method for a cleaning an anticatalytic material from an edge ring, according to one implementation; and To facilitate understanding, identical reference numerals have been used, where possible, to designate identical elements that are common to the figures. It is contemplated that elements and features of one implementation may be beneficially incorporated in other implementations without further recitation.

It is to be noted, however, that the appended drawings illustrate only exemplary implementations and are therefore not to be considered limiting of its scope, for the methods described herein may admit to other equally effective implementations.

DETAILED DESCRIPTION

Implementations described herein generally relate to methods for recovering chamber components from Ti-poisoning after an etch process in semiconductor applications.

In one example, the method includes delivering a remote plasma to a catalytic edge ring, such as a nickel edge ring. The remote plasma includes a hydrogen-containing species and a fluorine containing species.

During the etching process, some titanium is etched and redeposited onto the edge ring, which reduces catalytic activity of the edge ring and creates increased etching at the edge ring-substrate interface. By delivering a plasma comprising the hydrogen-containing precursor and the fluorine containing precursor to the edge ring, the edge ring can be cleaned and catalytic activity can be restored. This cleaning process reduces downtime and costs of replaced components. Implementations disclosed herein are more clearly described with reference to the figures below.

FIG. 1 is a cross sectional view of an illustrative process chamber 100 suitable for conducting an edge ring contaminant removal process as further described below. The process chamber 100 may be configured to remove materials from a material layer disposed on a substrate surface. The process chamber 100 is particularly useful for performing the plasma assisted dry etch process. The process chamber 100 may be a Frontier™, PCxT Reactive Preclean™ (RPC), AKTIV Pre-Clean™, Siconi™ or Capa™ chamber, which is available from Applied Materials, located in Santa Clara, Calif. It is noted that other vacuum process chambers available from other manufactures may also be adapted to practice the implementations described herein.

The process chamber 100 includes a chamber body 112, a lid assembly 140, and a support assembly 180. The lid assembly 140 is disposed at an upper end of the chamber body 112, and the support assembly 180 is at least partially disposed within the chamber body 112.

The chamber body 112 includes a slit valve opening 114 formed in a sidewall thereof to provide access to the interior of the process chamber 100. The slit valve opening 114 is selectively opened and closed to allow access to the interior of the chamber body 112 by a wafer handling robot (not shown).

In one or more implementations, the chamber body 112 includes a channel 115 formed therein for flowing a heat transfer fluid therethrough. The chamber body 112 can further include a liner 120 that surrounds the support assembly 180. The liner 120 is removable for servicing and cleaning. In one or more implementations, the liner 120 includes one or more apertures 125 and a pumping channel 129 formed therein that is in fluid communication with a vacuum system. The apertures 125 provide a flow path for gases into the pumping channel 129, which provides an egress for the gases within the process chamber 100.

The vacuum system can include a vacuum pump 130 and a throttle valve 132 to regulate flow of gases through the process chamber 100. The vacuum pump 130 is coupled to a vacuum port 131 disposed in the chamber body 112 and therefore, in fluid communication with the pumping channel 129 formed within the liner 120. The lid assembly 140 includes at least two stacked components configured to form a plasma volume or cavity therebetween, forming a remote plasma source. In one or more implementations, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143, 145 to provide a remote plasma to the processing region 141.

In one or more implementations, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof. In one or more implementations, the first electrode 143 has an expanding section 155 that houses the plasma cavity 150.

In one or more implementations, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150. A plasma generated in the plasma cavity 150 is defined in the lid assembly 140 prior to entering into a processing region 141 above the support assembly 180 wherein the substrate is proceed, the plasma is considered as a remote plasma source that generated remotely from the processing region 141.

The lid assembly 140 can further include an isolator ring 160 that electrically isolates the first electrode 143 from the second electrode 145. The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. In one or more implementations, the second electrode 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. In one or more implementations, the distribution plate 170 includes one or more embedded channels or passages 174 for housing a heater or heating fluid to provide temperature control of the lid assembly 140. The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution of gases to the distribution plate 170.

The support assembly 180 can include a support member 185 to support a substrate (not shown in this view) for processing within the chamber body 112. The support member 185 can be coupled to a lift mechanism 183 through a shaft 187 which extends through a centrally-located opening 116 formed in a bottom surface of the chamber body 112. The lift mechanism 183 can be flexibly sealed to the chamber body 112 by a bellows 188 that prevents vacuum leakage from around the shaft 187.

In one implementation, the electrode 181 that is coupled to a plurality of RF bias power sources 184, 186. The RF bias power sources 184, 186 are coupled between the electrode 181 disposed in the support member 185. The RF bias power excites and sustains a plasma discharge formed from the gases disposed in the processing region 141 of the chamber body.

In the implementation depicted in FIG. 1, the dual RF bias power sources 184, 186 are coupled to the electrode 181 disposed in the support member 185 through a matching circuit 189. The signal generated by the RF bias power sources 184, 186 is delivered through matching circuit 189 to the support member 185 through a single feed to ionize the gas mixture provided in the process chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. Additional bias power sources may be coupled to the electrode 181 to control the characteristics of the plasma as needed.

The support member 185 can include bores 192 formed therethrough to accommodate lift pins 193, one of which is shown in FIG. 1. Each lift pin 193 is constructed of ceramic or ceramic-containing materials, and are used for substrate-handling and transport. The lift pin 193 is moveable within its respective bore 192 when engaging an annular lift ring 195 disposed within the chamber body 112. The support assembly 180 can further include an edge ring 196 disposed about the support member 185.

The temperature of the support assembly 180 can be controlled by a fluid circulated through a fluid channel 198 embedded in the body of the support member 185. In one or more implementations, the fluid channel 198 is in fluid communication with a heat transfer conduit 199 disposed through the shaft 187 of the support assembly 180. The fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 180 can further include an embedded thermocouple (not shown) for monitoring the temperature of the support surface of the support member 185. For example, a signal from the thermocouple may be used in a feedback loop to control the temperature or flow rate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within process chamber 100.

A system controller (not shown) can be used to regulate the operations of the process chamber 100. The system controller can operate under the control of a computer program stored on a memory of a computer. The computer program may include instructions that enable the cleaning process described below to be performed in the process chamber 100. For example, the computer program can dictate the process sequencing and timing, mixture of gases, chamber pressures, RF power levels, susceptor positioning, slit valve opening and closing, wafer cooling and other parameters of a particular process.

FIG. 2 illustrates a method 200 for cleaning an edge ring post etching of a substrate. In one or more implementations, the substrate comprises both silicon-containing components and metal-containing components, such as titanium-containing components. In one implementation, the substrate is etched using chlorine or fluorine. The etching process leaves behind anticatalytic components, such as titanium, in or on the edge ring. The edge ring is then treated with a plasma comprising hydrogen and fluorine, which removes the anticatalytic components from the edge ring. Using the method described herein restores the catalytic activity of the edge ring, reduces down time, reduces costs and preserves the chamber liner.

The method 200 begins at 202 by etching a substrate positioned in a processing region of a process chamber. The substrate may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 203 may have various dimensions, such as 200 mm, 300 mm, 450 mm, or other diameters, as well as, being a rectangular or square panel. Unless otherwise noted, examples described herein are conducted on substrates with a 300 mm diameter.

The substrate is positioned in conjunction with an edge ring. The edge ring includes a catalyst, such as nickel. In etching the substrate, the etchant partially abstracts anticatalytic materials from the substrate. Anticatalytic materials, as sued herein, describes any material which affects the catalytic properties of the edge ring, such as titanium. During normal etching operation, the etchants will accumulate at the interface between the edge ring and the substrate. This leads to surface non-uniformities, which can be deleterious to device performance. To prevent this, the edge ring includes a catalytic material, such as nickel. The catalytic material reduces etching activity of the etchant near the edge ring-substrate interface. Anticatalytic materials, such as titanium, reduce catalytic activity of the edge ring, thus allowing for surface non-uniformities during subsequent etch processes.

The substrate is then removed from the processing region, at 204. The substrate, being sufficiently etched, is then removed from the chamber. The substrate may be finished processing or may be moved to another chamber in a cluster tool. This both prevents further uncontrolled etching of the substrate and prevents further deposition of anticatalytic materials onto the edge ring.

A remote plasma is formed using an etching gas mixture, at 206. The etching gas mixture includes a hydrogen-containing precursor and a fluorine-containing precursor. The etching gas mixture is supplied into the process chamber to etch the anticatalytic material from the edge ring. The etching gas mixture is supplied continuously or intermittently to etch the anticatalytic material until enough of the anticatalytic material is removed to restore catalytic activity of the edge ring.

In one implementation, the etching gas mixture selected to etch the anticatalytic material includes at least a hydrogen-containing gas and a fluorine-containing precursor. Suitable examples of the fluorine-containing precursors include $F_2$, HF, $NF_3$, $XeF_2$, $CF_4$, $CHF_3$, $CH_2F_2$, $CH_3F$, combinations thereof, or the like.

Suitable examples of the hydrogen-containing precursor include $H_2$, $H_2O$, $H_2O_2$, combinations thereof, or the like. An inert gas may also be supplied into the etching gas mixture to assist the profile control as needed. Examples of the inert gas supplied in the gas mixture include Ar, He, Ne, Kr, Xe or the like. In one particular example, the etching gas mixture includes $NF_3$, $H_2$, and Ar or He.

Without intending to be bound by theory, it is believed that the combination of hydrogen and fluorine allow for cleaning of the edge ring without deleterious effects on process kit components in the process chamber. Hydrogen radicals generated in remote plasma react with Ti-species deposited on edge ring and other chamber parts to form hydrogen enriched chemical complexes (e.g., hydrogen interacting with $TiF_4$). These hydrogenated complexes revive the above mentioned catalytic process and reduce excess etchants near substrate edges.

In one implementation, the fluorine-containing precursor supplied in the etching gas mixture may be maintained at a flow rate by volume between about 100 sccm and about 10000 sccm. The $H_2$ gas may be maintained at a flow rate by volume between about 100 sccm and about 10000 sccm. The optional inert gas may be supplied to the process chamber at a flow rate by volume between about 0 sccm and about 10000 sccm. Alternatively, the flow amount of the fluorine-containing precursor and the hydrogen-containing precursor and the inert gas may be supplied in the gas mixture by a predetermined ratio. For example, the gas flow rate ratio by volume of the fluorine-containing precursor to the hydrogen-containing precursor is controlled at above about 1:1, such as at least 3:1. Alternatively, the gas flow rate ratio by volume of the fluorine-containing precursor to the inert gas is controlled at between about 1:1 and about 1:1000. In this context, "at least", "less than", "greater than" or other comparative measurements of the ratios describe increasing or decreasing values of the antecedent, rather than the consequent of the ratio.

The etching gas mixture can be supplied through the plasma cavity 150 into the process chamber 100 to form a remote plasma source in the plasma cavity 150 from the etching gas mixture for etching the silicon material 306.

The amount of gases introduced into the process chamber 100 from the etching gas mixture may be varied and adjusted to accommodate, for example, the thickness of the anticatalytic material to be removed, the geometry of the edge ring being cleaned, the volume capacity of the plasma, the volume capacity of the chamber body, as well as the capabilities of the vacuum system coupled to the chamber body.

It is noted that the ratio between the fluorine-containing precursor to hydrogen-containing precursor may also be adjusted to improve the etching selectivity, including the selectivity between the anticatalytic material and other materials in the edge ring. A remote plasma power from the power source 152 is generated to form a plasma in the plasma cavity from the etching gas mixture supplied as described above. The plasma generated remotely in the plasma cavity may have the etchants dissociated to form a relatively mild and gentle etchant, so as to slowly, gently and gradually etch the anticatalytic material, until the underlying edge ring material is exposed.

The remote plasma is then delivered to the edge ring in the processing region, at 208. The remote plasma removes the anticatalytic material from the edge ring. The remote plasma is then delivered to the edge ring to etch the anticatalytic material form the edge ring. The etch process may be controlled to proceed at a slow rate utilizing the remote plasma source. As a result, the remote plasma process provides good control for the interface etching and promotes high etching selectivity so as to allow precise etching end point of the anticatalytic material being removed from the edge ring without damaging the composition of the edge ring or aluminum components of the process kit.

During the etching process, several process parameters may be regulated to control the etching process. In one exemplary implementation, a process pressure in the process chamber 100 is regulated to less than 0.5 Torr, such as between about 10 mTorr and about 100 mTorr. Alternatively, a RF bias power may be optionally supplied through the RF bias power sources 184, 186 to the electrode 181 disposed in the substrate support member 185. For example, a RF bias power of about less than 300 Watts, such as less than 100 Watts, for example between about 20 Watts to about 95 Watts, may be applied while supplying etching gas mixture as needed. A RF source power may be optionally supplied to the process chamber 100 as needed. A substrate temperature is maintained between about 25 degrees Celsius to about 1000 degrees Celsius, such as between about 30 degrees Celsius and about 500 degrees Celsius, for example about 50 degrees Celsius and 150 degrees Celsius. In one implementation, no RF bias power or no RF source power is provided during the etching process to reduce ion bombardment. In another example, a RF bias power without RF source power is provided during the etching process to reduce ion bombardment. In yet another example, no RF bias power is provided during the etching process to reduce ion bombardment.

Thus, by delivering an activated first gas, including a hydrogen containing precursor and a fluorine containing precursor, excess anticatalytic materials can be removed from the catalytic edge ring. Recovery of the catalytic edge ring can lead to a multifold cost and time reduction when compared to other working solutions (e.g., parts replacement). Further, no chamber dissembling is required. Further, the above described method uses only minimum alteration to the preexisting etch and clean processes. Hydrogen precursor flow rate, plasma generation power, ICC process time allows the user to control edge etch amounts. Finally, the method described above has a tertiary benefit of reduction of certain metal contamination. Some metal contaminations in processing region (e.g., Chromium) can be eliminated, due to formation of volatile metallic-hydrides.

While the foregoing is directed to implementations of methods described herein, other and further implementations of the methods may be devised without departing from the basic scope thereof, and the scope thereof is determined by the claims that follow.

What is claimed is:

1. A cleaning method, comprising:
activating an etching gas mixture using a plasma to create an activated etching gas mixture, the etching gas mixture comprising hydrogen-containing precursor and a fluorine-containing precursor; and
delivering the activated etching gas mixture to a processing region of a process chamber, the process chamber having an edge ring positioned therein, the edge ring comprising a catalyst comprising nickel and anticatalytic material, wherein the activated gas removes the anticatalytic material from the edge ring.

2. The method of claim 1, wherein the hydrogen-containing precursor is $H_2$, $H_2O$, $H_2O_2$, or combinations thereof.

3. The method of claim 1, wherein the fluorine-containing precursor is $F_2$, HF, $NF_3$, $XeF_2$, $CF_4$, $CHF_3$, $CH_2F_2$, $CH_3F$ or combinations thereof.

4. The method of claim 1, wherein the ratio of the concentration of the hydrogen-containing precursor to the fluorine-containing precursor being at least a 3:1 ratio.

5. The method of claim 1, wherein activating an etching gas mixture further comprises forming a remote plasma from a plasma cavity defined in a lid of a process chamber.

6. The method of claim 1, further comprising maintaining the edge ring at a temperature of between about 25 degrees Celsius and about 1000 degrees Celsius.

7. The method of claim 1, further comprising supplying a RF bias power while delivering activated etching gas mixture through a remote plasma source without a RF source power.

8. The method of claim 1, further comprising maintaining a process pressure less than 0.5 Torr.

9. The method of claim 1, wherein the anticatalytic material is titanium.

10. A method for processing a substrate, comprising:
etching a substrate positioned in a processing region of a process chamber, the substrate being positioned in conjunction with an edge ring comprising a catalyst comprising nickel, wherein etching the substrate deposits an anticatalytic material on the edge ring;
removing the substrate from the processing region;
forming a remote plasma using an etching gas mixture, the etching gas mixture comprising a hydrogen-containing precursor and a fluorine-containing precursor; and
delivering the remote plasma to the edge ring in the processing region, wherein the remote plasma removes the anticatalytic material from the edge ring.

11. The method of claim 10, wherein the hydrogen-containing precursor is $H_2$, $H_2O$, $H_2O_2$, or combinations thereof.

12. The method of claim 10, wherein the fluorine-containing precursor is $F_2$, HF, $NF_3$, $XeF_2$, $CF_4$, $CHF_3$, $CH_2F_2$, $CH_3F$ or combinations thereof.

13. The method of claim 10, wherein the ratio of the concentration of the hydrogen-containing precursor to the fluorine-containing precursor being at least a 3:1 ratio.

14. The method of claim 10, wherein activating an etching gas mixture further comprises forming a remote plasma from a plasma cavity defined in a lid of a process chamber.

15. The method of claim 10, further comprising maintaining the edge ring at a temperature of between about 25 degrees Celsius and about 1000 degrees Celsius.

16. The method of claim 10, further comprising supplying a RF bias power during the remote plasma process without a RF source power.

17. The method of claim 10, further comprising maintaining a process pressure less than 0.5 Torr.

18. The method of claim 10, wherein the anticatalytic material is titanium.

19. A device cleaning method, comprising:
delivering a etching gas mixture to a plasma cavity of a process chamber, the process chamber having an edge ring, the edge ring comprising nickel and less than 5% titanium material;
forming a remote plasma using an etching gas mixture, the etching gas mixture comprising $H_2$ and $NF_3$, the ratio of the concentration of $H_2$ to $NF_3$ being at least a 3:1 ratio, wherein the antecedent of the ratio determines the minimum value; and
delivering the remote plasma from the plasma cavity to a processing region of the process chamber, wherein the remote plasma removes the titanium material from the edge ring.

20. The method of claim 19, wherein activating an etching gas mixture further comprises forming a remote plasma from a plasma cavity defined in a lid of a process chamber.

* * * * *